US008232841B1

(12) United States Patent
Aram (10) Patent No.: US 8,232,841 B1
(45) Date of Patent: Jul. 31, 2012

(54) AMPLIFIER WITH OUTPUT FILTERING (75) Inventor: Farbod Aram, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/034,613

(22) Filed: Feb. 24, 2011

Related U.S. Application Data (63) Continuation of application No. 11/588,931, filed on Oct. 27, 2006, now Pat. No. 7,898,334.

(51) Int. Cl.
*H04B 1/44* (2006.01)
(52) U.S. Cl. ........ 330/260; 330/282; 330/109; 330/103; 330/107; 330/294
(58) Field of Classification Search .................. 330/282, 330/109, 107, 103, 260, 294, 101
See application file for complete search history.

(56) References Cited

U.S. PATENT DOCUMENTS

| 3,412,342 A | | 11/1968 | Tonnessen |
| 4,187,479 A | | 2/1980 | Ishizuka et al. |
| 5,317,277 A | * | 5/1994 | Cavigelli ............... 330/109 |
| 2003/0117218 A1 | * | 6/2003 | Tichauer ............... 330/284 |

* cited by examiner

*Primary Examiner* — Michael Shingleton (57) ABSTRACT

An amplifier circuit includes an amplifier including an inverting input that communicates with an input signal, a non-inverting input, and an output. A first feedback path communicates with the inverting input and the output of the amplifier. A second feedback path communicates with the inverting input and the output of the amplifier. The first feedback path provides feedback at a lower frequency than the second feedback path. A first resistance has one end that communicates with the output of the amplifier. A first capacitance has one end that communicates with an opposite end of the load resistance. A second resistance has one end that communicates with the inverting input and an opposite end that communicates with the opposite end of the first resistance.

14 Claims, 12 Drawing Sheets

AMPLIFIER WITH OUTPUT FILTERING

FIELD

This application is a continuation of U.S. application Ser. No. 11/588,931, filed Oct. 27, 2006. The disclosure of the application referenced above is incorporated herein by reference.

BACKGROUND

The present disclosure relates to amplifier circuits, and more particularly to amplifier circuits with output filtering.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Figure 1:
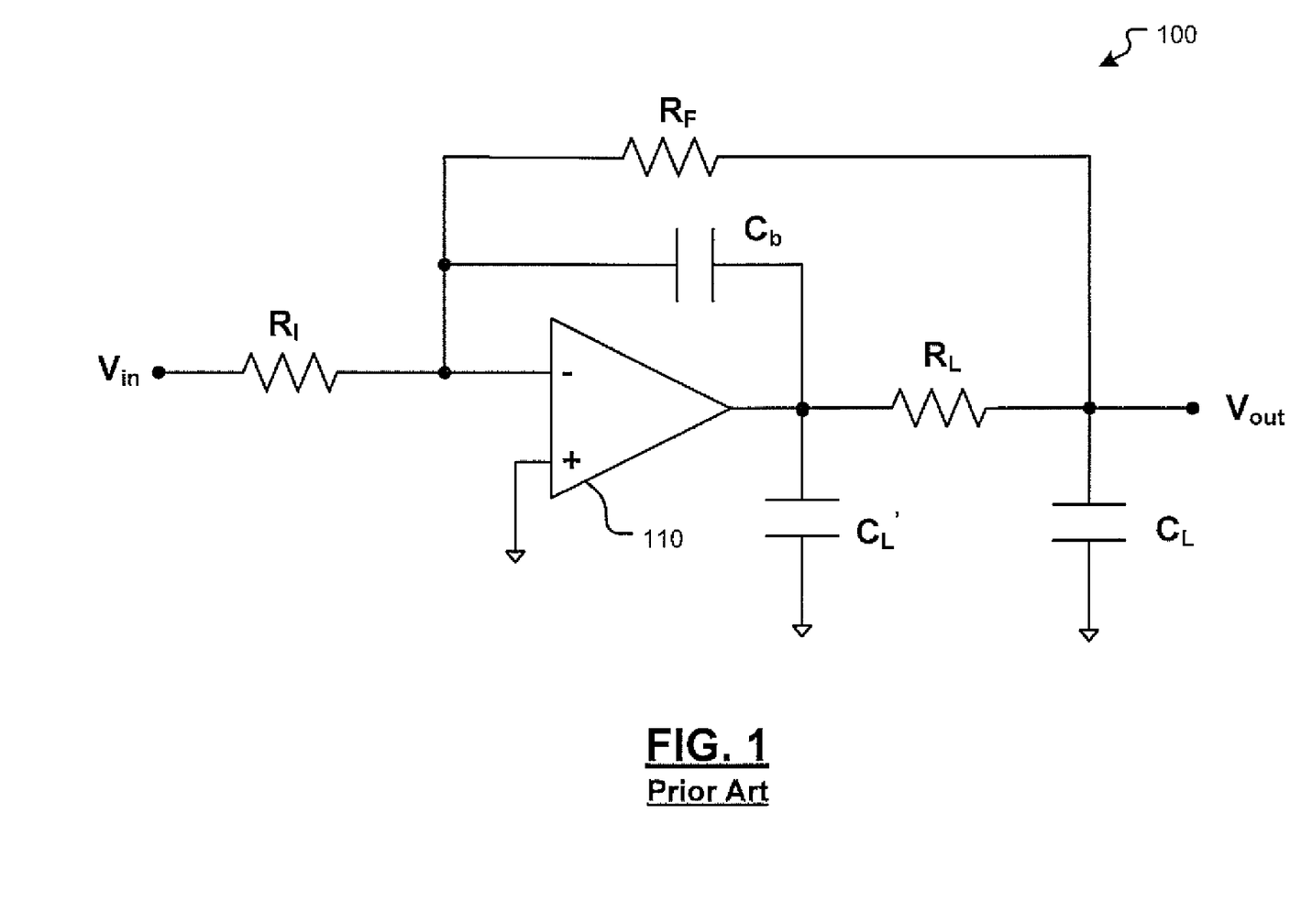
FIG. 1 is an electrical schematic of an amplifier circuit including output filtering according to the prior art.

Some amplifier circuits require filtering at an output thereof to reduce noise. It may be difficult to provide filtering without adversely impacting a corner frequency of the amplifier circuit. Referring now to FIG. 1, an amplifier circuit 100 includes an amplifier 110 having inverting and non-inverting inputs. The non-inverting input may communicate with a reference potential such as ground.

An input signal $V_{IN}$ is coupled through an input resistance $R_I$ to the inverting input.

A bypass capacitance $C_b$ has one end that communicates with the inverting input and an opposite end that communicates with the output of the amplifier 110. A load resistance $R_L$ has one end that communicates with the output of the amplifier 110, which has a gain A. A feedback resistance $R_F$ has one end that communicates with the inverting input of the amplifier 110 and an opposite end that communicates with an opposite end of the load resistance $R_L$. For example only, the input resistance $R_I$ and feedback resistance $R_F$ may be substantially equal resistance values, such as a resistance R. In the description that follows, $R=R_F=R_I$.

A load capacitance $C_L$ has one end that communicates with the opposite end of the load resistance $R_L$ and an opposite end that communicates with the reference potential. Another capacitance $C_L'$ has one end that communicates with the output of the amplifier 110 and an opposite end that communicates with the reference potential. An output voltage $V_{OUT}$ is taken at the one end of the load capacitance $C_L$. The load resistance $R_L$ and the load capacitance $C_2$ provide filtering at the output of the amplifier circuit.

Figure 2:
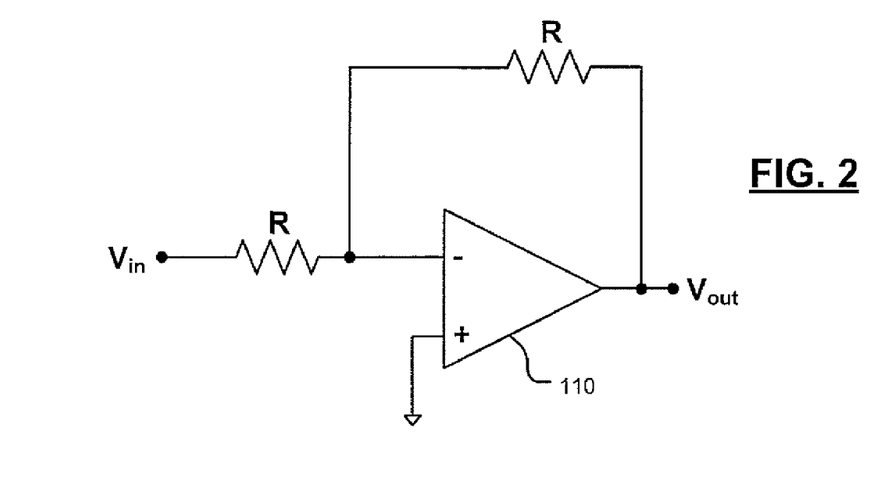
FIG. 2 is an electrical schematic of an equivalent circuit of the amplifier circuit operating at low-frequency.
Figure 3:
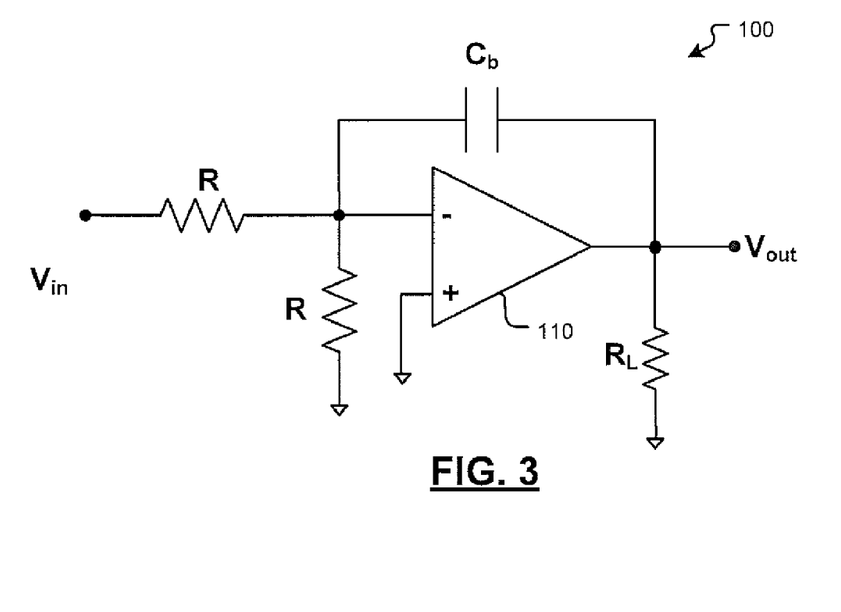
FIG. 3 is an electrical schematic of an equivalent circuit of the amplifier circuit operating at high-frequency.

Referring now to FIGS. 2 and 3, operating characteristics of the amplifier circuit are shown. In FIG. 2, a low-frequency or DC equivalent circuit of the amplifier circuit 100 is shown. At low-frequency, the capacitances in the circuit of FIG. 1 are open circuits. Noise at the input is amplified and output. In FIG. 3, a high-frequency equivalent circuit of the amplifier circuit 100 is shown. At high-frequency, the capacitances in the circuit of FIG. 1 are short circuits. As can be appreciated, the value of the capacitance $C_b$ must be sufficiently large for the circuit to operate correctly.

Figure 4:
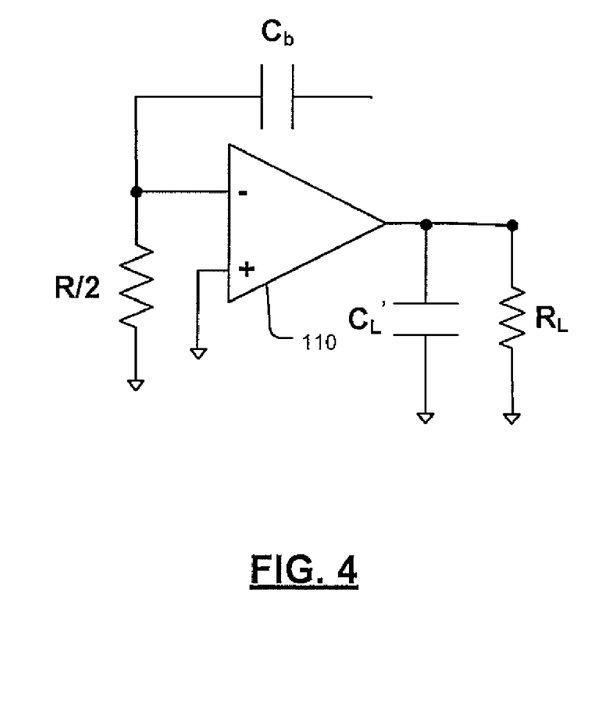
FIG. 4 is electrical schematic of an open loop response of the amplifier circuit.
Figure 5:
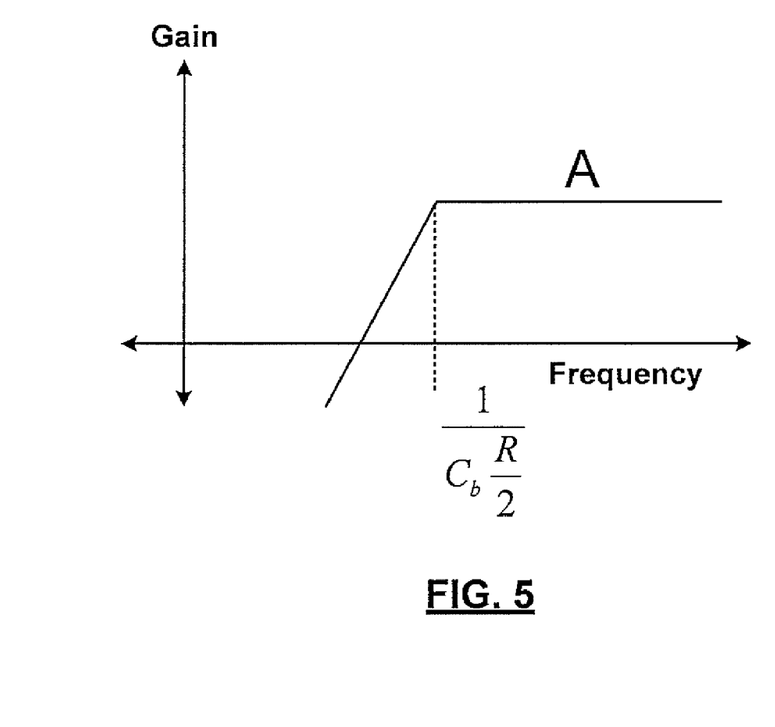
FIG. 5 is a graph of gain as a function of frequency for the amplifier circuit of FIG. 1.

Referring now to FIGS. 4 and 5, an open loop response of the circuit of FIG. 1 is shown. In FIG. 5, the gain of the amplifier increases and then levels off at a corner frequency that is approximately equal to $$\frac{1}{C_b \frac{R}{2}}.$$

As discussed above, the value of the bypass capacitance $C_b$ should be relatively large, which increases the corner frequency. Some applications may require the corner frequency to occur at a lower frequency while still providing output filtering.

SUMMARY

An amplifier circuit comprises an amplifier including an inverting input that communicates with an input signal, a non-inverting input, and an output. A first feedback path communicates with the inverting input and the output of the amplifier. A second feedback path communicates with the inverting input and the output of the amplifier. The first feedback path provides feedback at a lower frequency than the second feedback path. A first resistance has one end that communicates with the output of the amplifier. A first capacitance has one end that communicates with an opposite end of the load resistance. A second resistance has one end that communicates with the inverting input and an opposite end that communicates with the opposite end of the first resistance.

In other features, the first feedback path includes a third resistance in series with a second capacitance. The second feedback path includes a second capacitance. The first feedback path includes a third resistance in series with a second capacitance. The second feedback path includes a third capacitance having a capacitance value that is substantially greater than a capacitance value of the second capacitance. A third resistance had one end that communicates with the input signal and an opposite end that communicates with the inverting input. A second capacitance has one end that communicates with the output of the amplifier.

An amplifier circuit comprises an amplifier including an inverting input that communicates with an input signal, a non-inverting input, and an output. A first resistance is connected in series with a first capacitance. One of the first resistance and the first capacitance communicates with the inverting input and the other of the first resistance and the first capacitance communicates the output of the amplifier. A second capacitance communicates with the inverting input and the output of the amplifier. A second resistance has one end that communicates with the output of the amplifier. A second capacitance has one end that communicates with an opposite end of the load resistance. A third resistance has one end that communicates with the inverting input and an opposite end that communicates with the opposite end of the first resistance.

In other features, the first capacitance has a capacitance value that is substantially greater than a capacitance value of the second capacitance. A third resistance has one end that communicates with the input signal and an opposite end that communicates with the inverting input. A fourth capacitance has one end that communicates with the output of the amplifier.

Further areas of applicability of the present disclosure will become apparent from the detailed description provided hereinafter. It should be understood that the detailed description and specific examples, while indicating the preferred embodi-

BRIEF DESCRIPTION OF THE DRAWINGS

The present disclosure will become more fully understood from the detailed description and the accompanying drawings, wherein.

DETAILED DESCRIPTION

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

Figure 6:
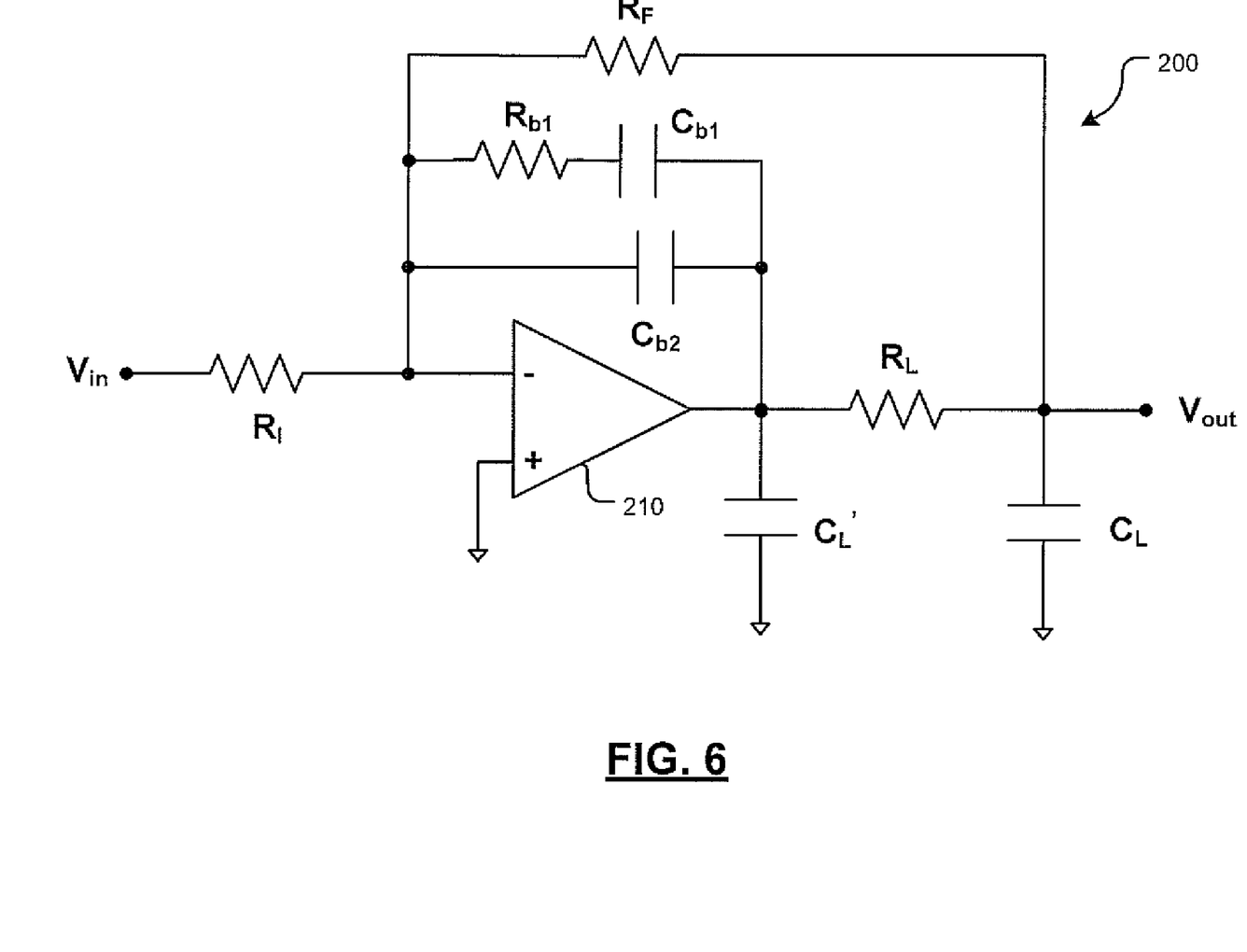
FIG. 6 is an electrical schematic of an amplifier circuit according to the present disclosure.

Referring now to FIG. 6, an amplifier circuit 200 according to a present disclosure is shown. The amplifier circuit 200 includes an amplifier 210 having inverting and non-inverting inputs. The non-inverting input may communicate with a reference potential such as ground. An input signal is coupled through an input resistance $R_I$ to the inverting input.

A first bypass resistance $R_{b1}$ has one end that communicates with the inverting input of the amplifier 210. A first bypass capacitance $C_{b1}$ has one end that communicates with an opposite end of the first bypass resistance $R_{b1}$. An opposite end of the first bypass capacitance $C_{b1}$ communicates with the output of the amplifier 210. A second bypass capacitance $C_{b2}$ has one end that communicates with the inverting input of the amplifier 210 and an opposite end that communicates with the output of the amplifier 210.

A load resistance $R_L$ has one end that communicates with the output of the amplifier 210. A feedback resistance $R_F$ has one end that communicates with the inverting input of the amplifier 210 and an opposite end that communicates with an opposite end of the load resistance $R_L$. For example only, the input resistance $R_I$ and feedback resistance $R_F$ may be substantially equal resistance values, such as resistance R. In the description that follows, $R=R_F=R_I$. However, $R_F$ and $R_I$ need not have the same resistance values.

A load capacitance $C_L$ has one end that communicates with the opposite end of the load resistance $R_L$ and an opposite end that communicates with the reference potential. Another capacitance $C_L'$ has one end that communicates with the output of the amplifier 110 and an opposite end that communicates with the reference potential.

Figure 7:
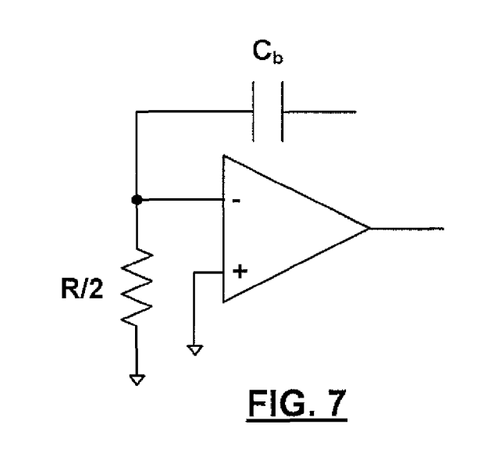
FIG. 7 is electrical schematic of an open loop response of the amplifier circuit of FIG. 1.
Figure 8:
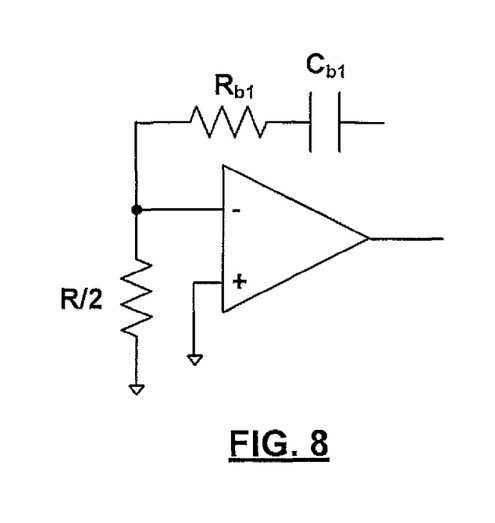
FIG. 8 is electrical schematic of an open loop response of the amplifier circuit of FIG. 6.
Figure 9:
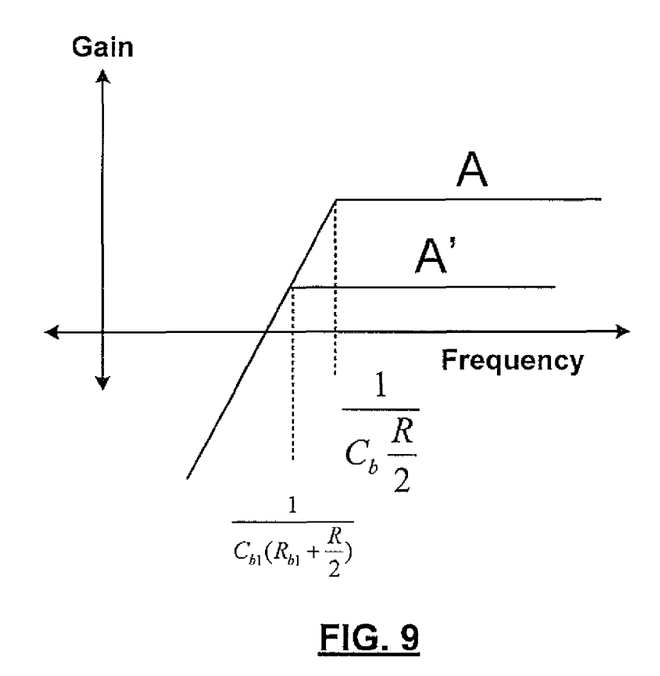
FIG. 9 is a graph of gain as a function of frequency for the amplifier circuits of FIGS. 1 and 6.

Referring now to FIGS. 7-9, performance of the amplifier circuits of FIGS. 1 and 6 are shown. In FIGS. 7 and 8, open loop responses of the circuit of FIGS. 1 and 6 are shown, respectively. Assuming that the amplifiers of FIGS. 1 and 6 have the same gain, the corner frequency of the amplifier circuit of FIG. 6 occurs at a frequency that is lower than the corner frequency of the circuit of FIG. 1. However, the gain of the circuit of FIG. 6 is less than the gain on the amplifier circuit in FIG. 1.

The corner frequency of the amplifier circuit 100 of FIG. 1 occurs at $$\frac{1}{C_b \frac{R}{2}}.$$

The corner frequency of the amplifier circuit 200 of FIG. 6 occurs at $$\frac{1}{C_{b1}\left(R_{b1} + \frac{R}{2}\right)}.$$

In some implementations, $C_b \ll C_{b1}$. $C_{b2}$ may be set equal to $C_b$ and/or any other suitable value.

Referring back to FIG. 6, in operation the first bypass capacitance $C_{b1}$ and the first bypass resistance $R_{b1}$ provide feedback at a lower frequency than the second bypass capacitance $C_{b2}$. In other words, a first feedback path of the first bypass capacitance $C_{b1}$ and the first bypass resistance $R_{b1}$ provides feedback at a lower frequency than the second bypass capacitance $C_{b2}$. As a result, the amplifier circuit has a linear gain profile at a lower frequency while still providing output filtering.

Figure 10:
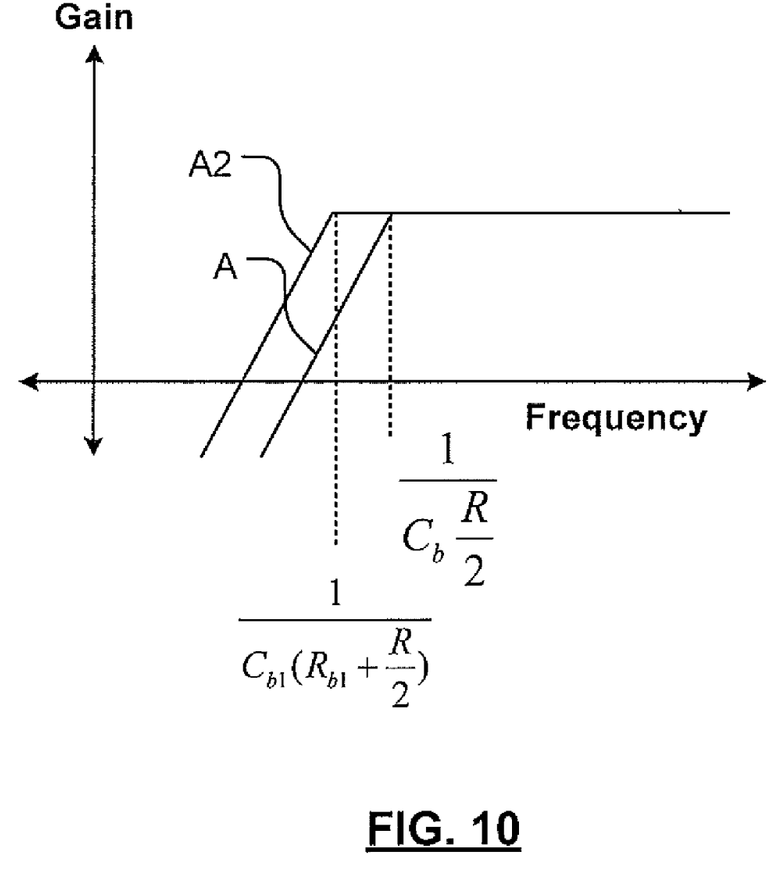
FIG. 10 is a graph of gain as a function of frequency for the amplifier circuits of FIG. 1 and an amplifier circuit similar to FIG. 6 with a higher gain amplifier.
Figure 11:
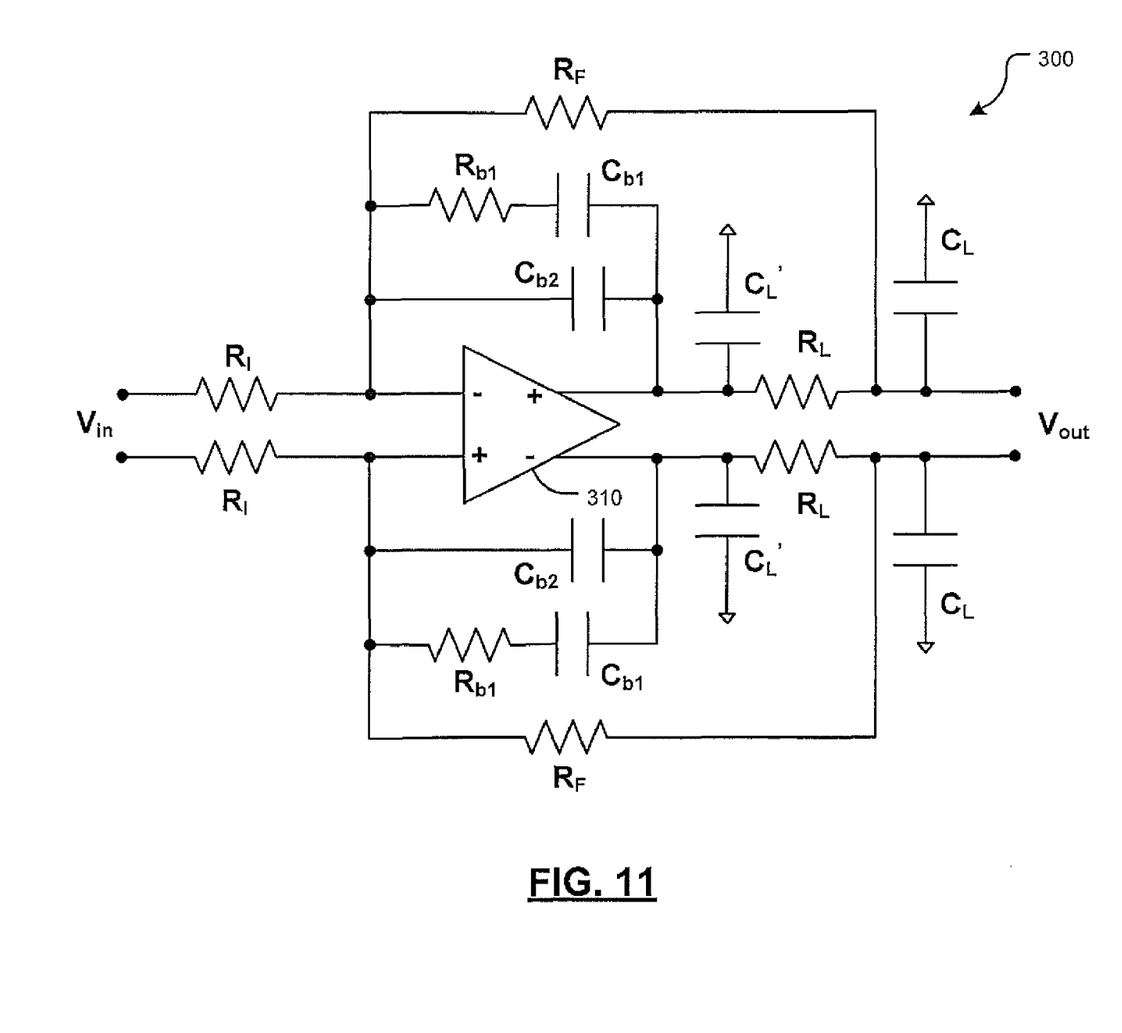
FIG. 11 is an electrical schematic of a differential amplifier circuit according to the present disclosure.

Referring now to FIGS. 10 and 11, other amplifier circuits are shown. In FIG. 10, the gain of the amplifier 210 of FIG. 6 can be increased relative to the gain of the amplifier 110 of FIG. 1 to provide a similar gain level as the amplifier circuit of FIG. 1 with a lower corner frequency. In FIG. 11, a differential amplifier circuit 300 that is similar to FIG. 6 is shown.

Referring now to FIGS. 12A-12G, various exemplary implementations incorporating the teachings of the present disclosure are shown.

Figure 12A:
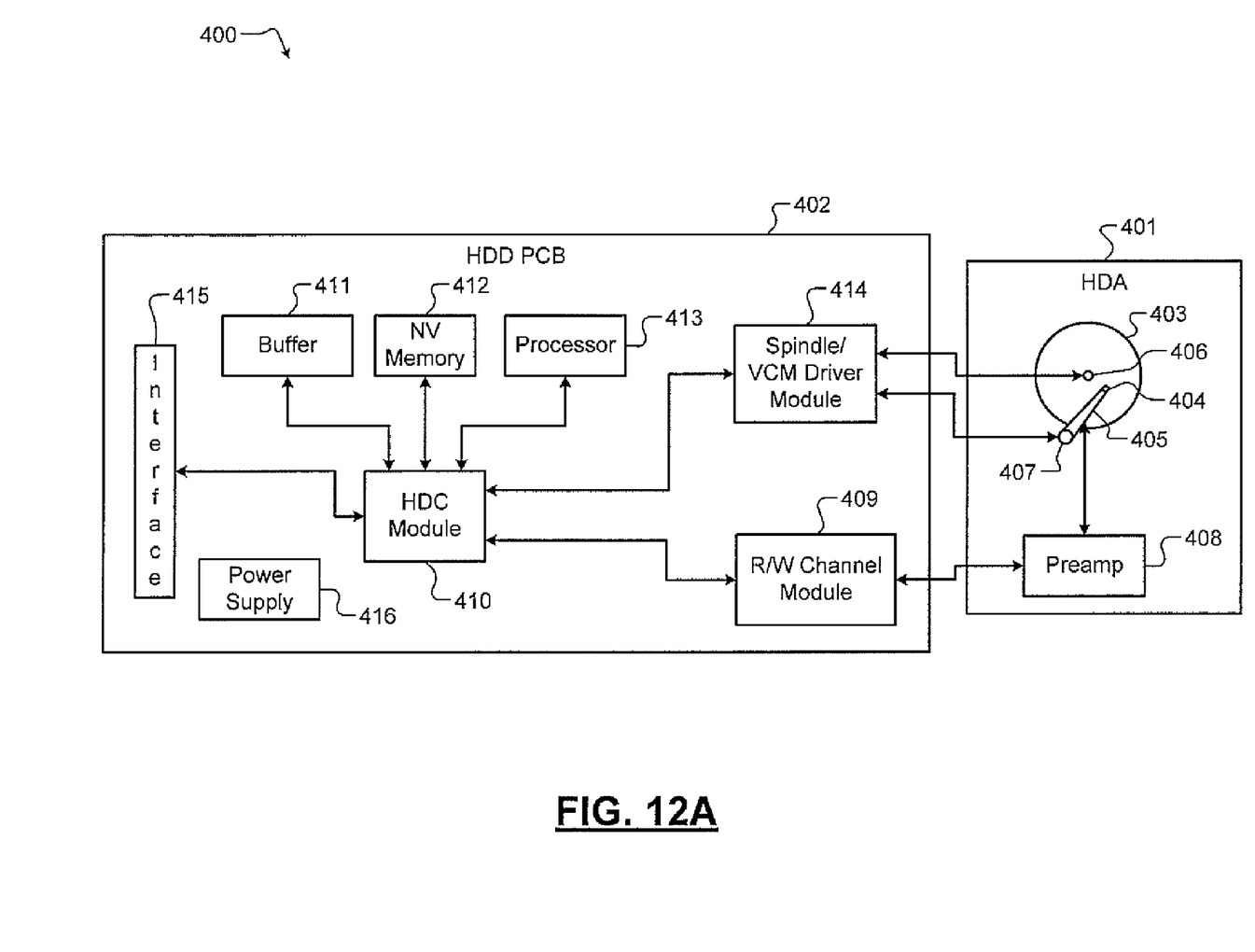
FIG. 12A is a functional block diagram of a hard disk drive.

Referring now to FIG. 12A, the teachings of the disclosure can be implemented in an amplifier circuit of a hard disk drive (HDD) 400. The HDD 400 includes a hard disk assembly (HDA) 401 and a HDD PCB 402. The HDA 401 may include a magnetic medium 403, such as one or more platters that store data, and a read/write device 404. The read/write device 404 may be arranged on an actuator arm 405 and may read and write data on the magnetic medium 403. Additionally, the HDA 401 includes a spindle motor 406 that rotates the magnetic medium 403 and a voice-coil motor (VCM) 407 that actuates the actuator arm 405. A preamplifier device 408 amplifies signals generated by the read/write device 404 during read operations and provides signals to the read/write device 404 during write operations.

The HDD PCB 402 includes a read/write channel module (hereinafter, "read channel") 409, a hard disk controller (HDC) module 410, a buffer 411, nonvolatile memory 412, a processor 413, and a spindle/VCM amplifier circuit module 414. The read channel 409 processes data received from and transmitted to the preamplifier device 408. The HDC module 410 controls components of the HDA 401 and communicates with an external device (not shown) via an I/O interface 415. The external device may include a computer, a multimedia device, a mobile computing device, etc. The I/O interface 415 may include wireline and/or wireless communication links.

The HDC module 410 may receive data from the HDA 401, the read channel 409, the buffer 411, nonvolatile memory 412, the processor 413, the spindle/VCM amplifier circuit module 414, and/or the I/O interface 415. The processor 413 may process the data, including encoding, decoding, filtering, and/or formatting. The processed data may be output to the HDA 401, the read channel 409, the buffer 411, nonvolatile memory 412, the processor 413, the spindle/VCM amplifier circuit module 414, and/or the I/O interface 415.

The HDC module 410 may use the buffer 411 and/or nonvolatile memory 412 to store data related to the control and operation of the HDD 400. The buffer 411 may include DRAM, SDRAM, etc. The nonvolatile memory 412 may include flash memory (including NAND and NOR flash memory), phase change memory, magnetic RAM, or multi-state memory, in which each memory cell has more than two states. The spindle/VCM amplifier circuit module 414 controls the spindle motor 406 and the VCM 407. The HDD PCB 402 includes a power supply 416 that provides power to the components of the HDD 400.

Figure 12B:
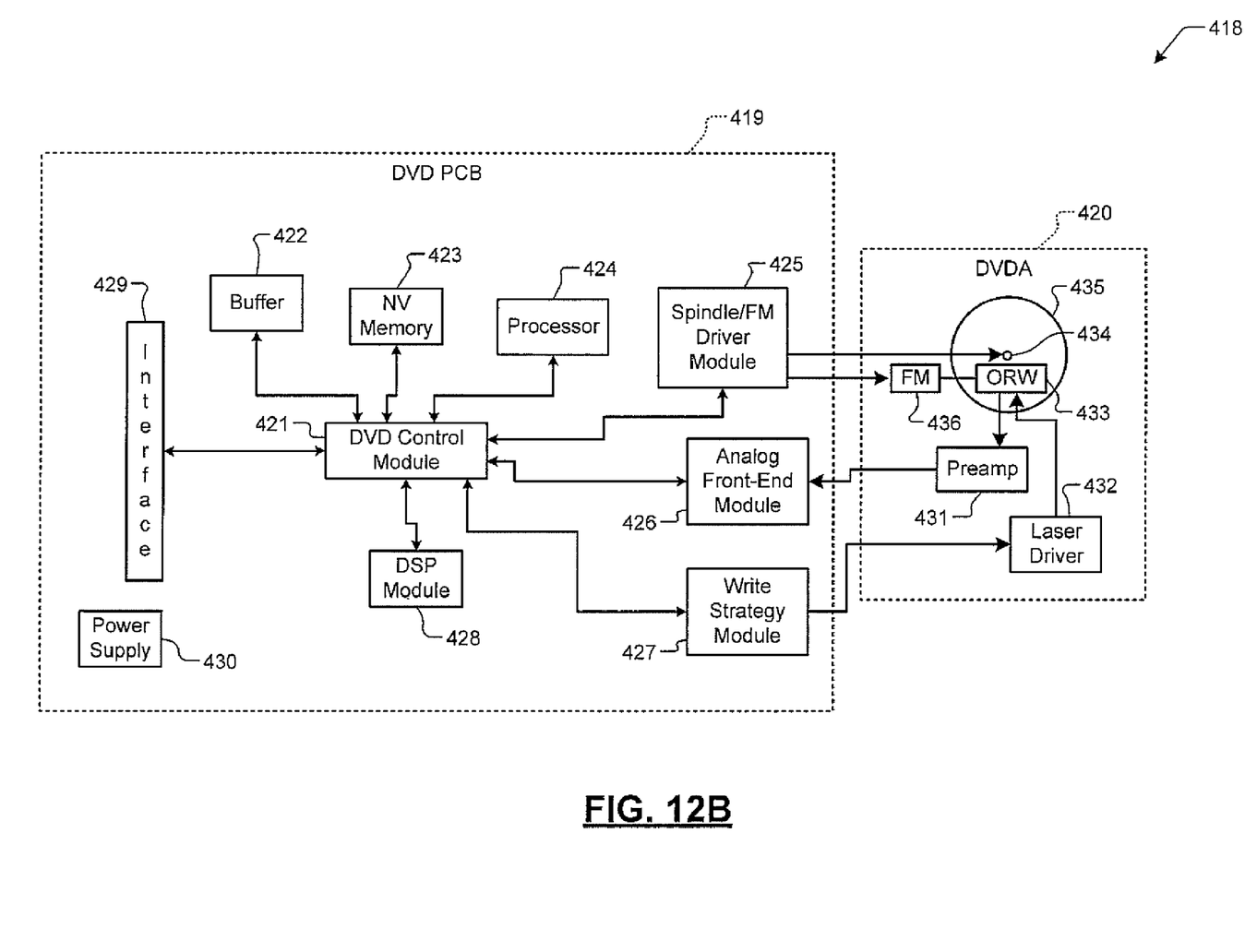
FIG. 12B is a functional block diagram of a DVD drive.

Referring now to FIG. 12B, the teachings of the disclosure can be implemented in an amplifier circuit of a DVD drive 418 or of a CD drive (not shown). The DVD drive 418 includes a DVD PCB 419 and a DVD assembly (DVDA) 420. The DVD PCB 419 includes a DVD control module 421, a buffer 422, nonvolatile memory 423, a processor 424, a spindle/FM (feed motor) amplifier circuit module 425, an analog front-end module 426, a write strategy module 427, and a DSP module 428.

The DVD control module 421 controls components of the DVDA 420 and communicates with an external device (not shown) via an I/O interface 429. The external device may include a computer, a multimedia device, a mobile computing device, etc. The I/O interface 429 may include wireline and/or wireless communication links.

The DVD control module 421 may receive data from the buffer 422, nonvolatile memory 423, the processor 424, the spindle/FM amplifier circuit module 425, the analog front-end module 426, the write strategy module 427, the DSP module 428, and/or the I/O interface 429. The processor 424 may process the data, including encoding, decoding, filtering, and/or formatting. The DSP module 428 performs signal processing, such as video and/or audio coding/decoding. The processed data may be output to the buffer 422, nonvolatile memory 423, the processor 424, the spindle/FM amplifier circuit module 425, the analog front-end module 426, the write strategy module 427, the DSP module 428, and/or the I/O interface 429.

The DVD control module 421 may use the buffer 422 and/or nonvolatile memory 423 to store data related to the control and operation of the DVD drive 418. The buffer 422 may include DRAM, SDRAM, etc. The nonvolatile memory 423 may include flash memory (including NAND and NOR flash memory), phase change memory, magnetic RAM, or multi-state memory, in which each memory cell has more than two states. The DVD PCB 419 includes a power supply 430 that provides power to the components of the DVD drive 418.

The DVDA 420 may include a preamplifier device 431, a laser amplifier circuit 432, and an optical device 433, which may be an optical read/write (ORW) device or an optical read-only (OR) device. A spindle motor 434 rotates an optical storage medium 435, and a feed motor 436 actuates the optical device 433 relative to the optical storage medium 435.

When reading data from the optical storage medium 435, the laser amplifier circuit provides a read power to the optical device 433. The optical device 433 detects data from the optical storage medium 435, and transmits the data to the preamplifier device 431. The analog front-end module 426 receives data from the preamplifier device 431 and performs such functions as filtering and A/D conversion. To write to the optical storage medium 435, the write strategy module 427 transmits power level and timing information to the laser amplifier circuit 432. The laser amplifier circuit 432 controls the optical device 433 to write data to the optical storage medium 435.

Figure 12C:
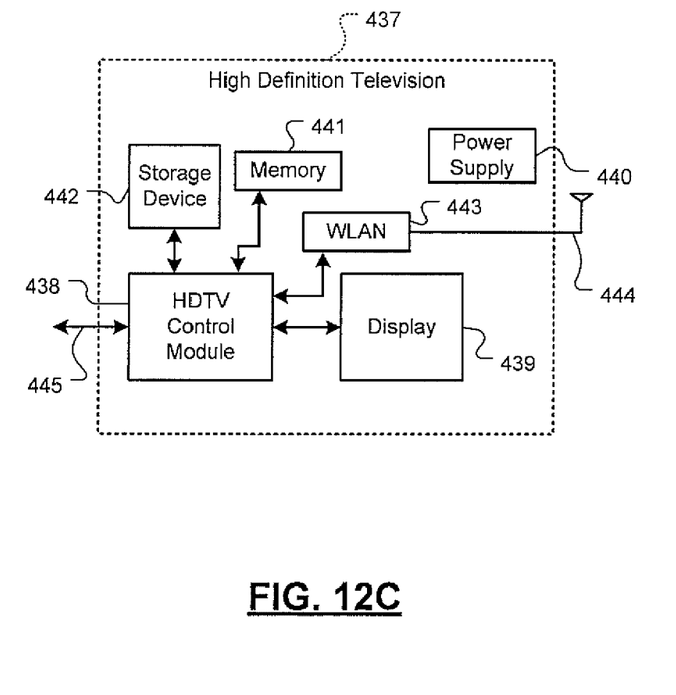
FIG. 12C is a functional block diagram of a high definition television.

Referring now to FIG. 12C, the teachings of the disclosure can be implemented in an amplifier circuit of a high definition television (HDTV) 437. The HDTV 437 includes a HDTV control module 438, a display 439, a power supply 440, memory 441, a storage device 442, a WLAN interface 443 and associated antenna 444, and an external interface 445.

The HDTV 437 can receive input signals from the WLAN interface 443 and/or the external interface 445, which sends and receives information via cable, broadband Internet, and/or satellite. The HDTV control module 438 may process the input signals, including encoding, decoding, filtering, and/or formatting, and generate output signals. The output signals may be communicated to one or more of the display 439, memory 441, the storage device 442, the WLAN interface 443, and the external interface 445.

Memory 441 may include random access memory (RAM) and/or nonvolatile memory such as flash memory, phase change memory, or multi-state memory, in which each memory cell has more than two states. The storage device 442 may include an optical storage drive, such as a DVD drive, and/or a hard disk drive (HDD). The HDTV control module 438 communicates externally via the WLAN interface 443 and/or the external interface 445. The power supply 440 provides power to the components of the HDTV 437.

Figure 12D:
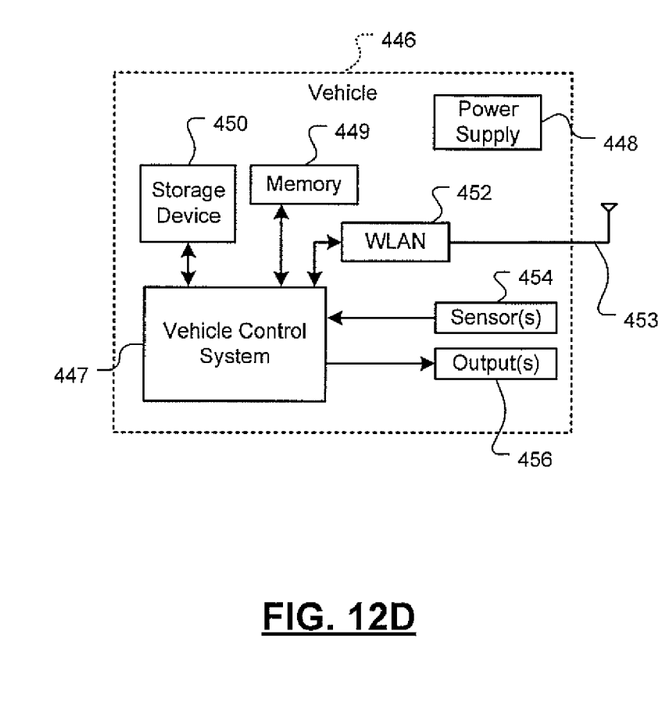
FIG. 12D is a functional block diagram of a vehicle control system.

Referring now to FIG. 12D, the teachings of the disclosure may be implemented in an amplifier circuit of a vehicle 446. The vehicle 446 may include a vehicle control system 447, a power supply 448, memory 449, a storage device 450, and a WLAN interface 452 and associated antenna 453. The vehicle control system 447 may be a powertrain control system, a body control system, an entertainment control system, an anti-lock braking system (ABS), a navigation system, a telematics system, a lane departure system, an adaptive cruise control system, etc.

The vehicle control system 447 may communicate with one or more sensors 454 and generate one or more output signals 456. The sensors 454 may include temperature sensors, acceleration sensors, pressure sensors, rotational sensors, airflow sensors, etc. The output signals 456 may control engine operating parameters, transmission operating parameters, suspension parameters, etc.

The power supply 448 provides power to the components of the vehicle 446. The vehicle control system 447 may store data in memory 449 and/or the storage device 450. Memory 449 may include random access memory (RAM) and/or nonvolatile memory such as flash memory, phase change memory, or multi-state memory, in which each memory cell has more than two states. The storage device 450 may include an optical storage drive, such as a DVD drive, and/or a hard disk drive (HDD). The vehicle control system 447 may communicate externally using the WLAN interface 452.

Figure 12E:
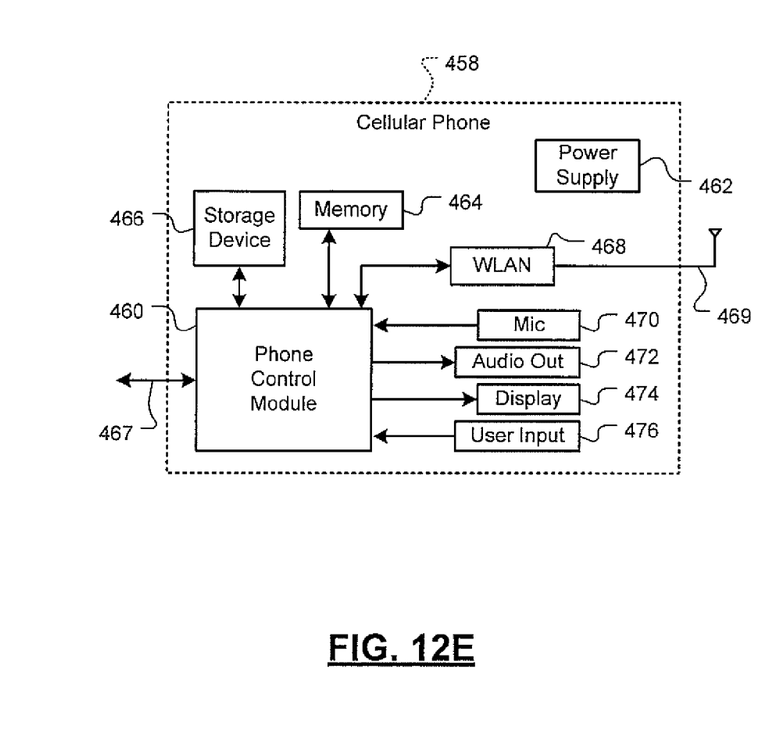
FIG. 12E is a functional block diagram of a cellular phone.

Referring now to FIG. 12E, the teachings of the disclosure can be implemented in an amplifier circuit of a cellular phone 458. The cellular phone 458 includes a phone control module 460, a power supply 462, memory 464, a storage device 466, and a cellular network interface 467. The cellular phone 458 may include a WLAN interface 468 and associated antenna 469, a microphone 470, an audio output 472 such as a speaker and/or output jack, a display 474, and a user input device 476 such as a keypad and/or pointing device.

The phone control module 460 may receive input signals from the cellular network interface 467, the WLAN interface 468, the microphone 470, and/or the user input device 476. The phone control module 460 may process signals, including encoding, decoding, filtering, and/or formatting, and generate output signals. The output signals may be communicated to one or more of memory 464, the storage device 466, the cellular network interface 467, the WLAN interface 468, and the audio output 472.

Memory 464 may include random access memory (RAM) and/or nonvolatile memory such as flash memory, phase change memory, or multi-state memory, in which each memory cell has more than two states. The storage device 466 may include an optical storage drive, such as a DVD drive, and/or a hard disk drive (HDD). The power supply 462 provides power to the components of the cellular phone 458.

Figure 12F:
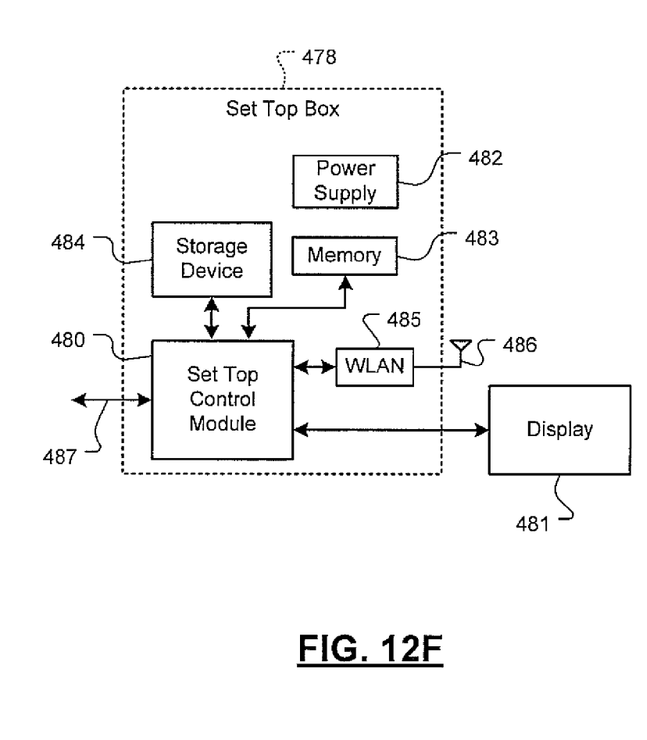
FIG. 12F is a functional block diagram of a set top box.

Referring now to FIG. 12F, the teachings of the disclosure can be implemented in an amplifier circuit of a set top box 478. The set top box 478 includes a set top control module 480, a display 481, a power supply 482, memory 483, a storage device 484, and a WLAN interface 485 and associated antenna 486.

The set top control module 480 may receive input signals from the WLAN interface 485 and an external interface 487, which can send and receive information via cable, broadband Internet, and/or satellite. The set top control module 480 may process signals, including encoding, decoding, filtering, and/or formatting, and generate output signals. The output signals may include audio and/or video signals in standard and/or high definition formats. The output signals may be communicated to the WLAN interface 485 and/or to the display 481. The display 481 may include a television, a projector, and/or a monitor.

The power supply 482 provides power to the components of the set top box 478. Memory 483 may include random access memory (RAM) and/or nonvolatile memory such as flash memory, phase change memory, or multi-state memory, in which each memory cell has more than two states. The storage device 484 may include an optical storage drive, such as a DVD drive, and/or a hard disk drive (HDD).

Figure 12G:
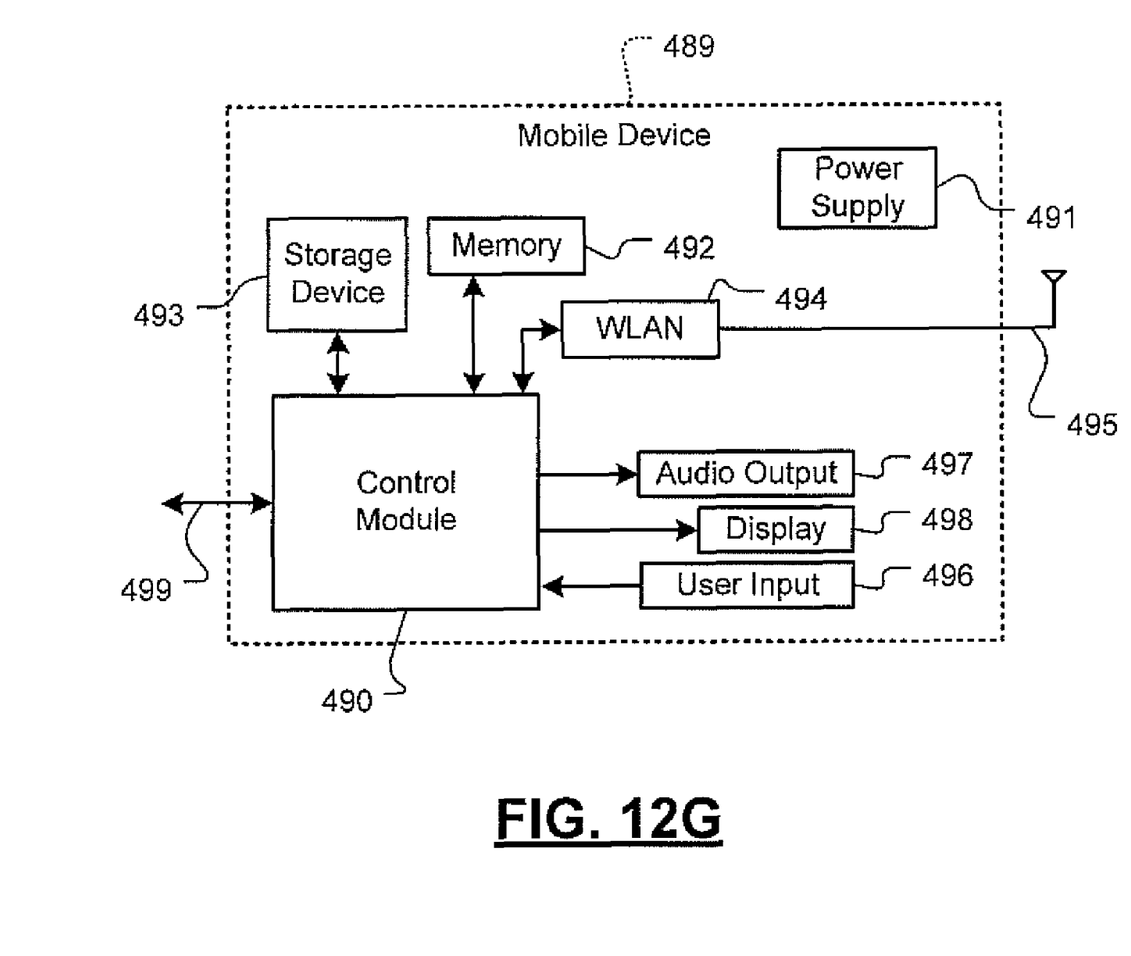
FIG. 12G is a functional block diagram of a mobile device.

Referring now to FIG. 12G, the teachings of the disclosure can be implemented in an amplifier circuit of a mobile device 489. The mobile device 489 may include a mobile device control module 490, a power supply 491, memory 492, a storage device 493, a WLAN interface 494 and associated antenna 495, and an external interface 499.

The mobile device control module 490 may receive input signals from the WLAN interface 494 and/or the external interface 499. The external interface 499 may include USB, infrared, and/or Ethernet. The input signals may include compressed audio and/or video, and may be compliant with the MP3 format. Additionally, the mobile device control module 490 may receive input from a user input 496 such as a keypad, touchpad, or individual buttons. The mobile device control module 490 may process input signals, including encoding, decoding, filtering, and/or formatting, and generate output signals.

The mobile device control module 490 may output audio signals to an audio output 497 and video signals to a display 498. The audio output 497 may include a speaker and/or an output jack. The display 498 may present a graphical user interface, which may include menus, icons, etc. The power supply 491 provides power to the components of the mobile device 489. Memory 492 may include random access memory (RAM) and/or nonvolatile memory such as flash memory, phase change memory, or multi-state memory, in which each memory cell has more than two states. The storage device 493 may include an optical storage drive, such as a DVD drive, and/or a hard disk drive (HDD). The mobile device may be any battery-powered device such as but not limited to media players, personal digital assistants, and/or other devices.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. An amplifier circuit, comprising:
    an amplifier having an inverting input and an output, the amplifier configured to amplify an input signal;
    a first feedback path including a first capacitance, the first feedback path configured to provide feedback from the output of the amplifier to the inverting input of the amplifier when the input signal is in a first frequency range; and
    a second feedback path including a first resistance and a second capacitance connected in series, the second feedback path configured to provide feedback from the output of the amplifier to the inverting input of the amplifier when the input signal is in a second frequency range,
    wherein the second frequency range is less than the first frequency range, and wherein a corner frequency of the amplifier circuit corresponds to a value of the second capacitance.

2. The amplifier circuit of claim 1, further comprising a second resistance, wherein the input signal is provided to the inverting input of the amplifier through the second resistance.

3. The amplifier circuit of claim 1, further comprising a third feedback path including a second resistance, the third feedback path configured to provide feedback from the output of the amplifier to the inverting input of the amplifier.

4. The amplifier circuit of claim 1, further comprising a second resistance having i) a first end connected to the output of the amplifier and ii) a second end connected to an output of the amplifier circuit.

5. The amplifier circuit of claim 4, further comprising a third capacitance having i) a first end connected to the first end of the second resistance and ii) a second end connected to ground.

6. The amplifier circuit of claim 5, further comprising a fourth capacitance having i) a first end connected to the second end of the second resistance and ii) a second end connected to ground.

7. The amplifier circuit of claim 1, wherein the first capacitance is less than the second capacitance.

8. The amplifier circuit of claim 1, wherein a linear gain profile of the amplifier circuit is based on a value of the second capacitance.

9. The amplifier circuit of claim 1, further comprising:
a third feedback path including a third capacitance, the third feedback path configured to provide feedback from the output of the amplifier to a second input of the amplifier when the input signal is in the first frequency range; and
a fourth feedback path including a fourth capacitance, the fourth feedback path configured to provide feedback from the output of the amplifier to the second input of the amplifier when the input signal is in the second frequency range.

10. A method for operating an amplifier circuit, the method comprising:
amplifying an input signal using an amplifier, wherein the amplifier has i) an inverting input to receive the input signal and ii) an output;
using a first feedback path including a first resistance and a first capacitance connected in series, providing feedback from the output of the amplifier to the inverting input of the amplifier when the input signal is in a first frequency range; and
using a second feedback path including a second capacitance, providing feedback from the output of the amplifier to the inverting input of the amplifier when the input signal is in a second frequency range,
wherein the second frequency range is less than the first frequency range, and wherein a corner frequency of the amplifier circuit corresponds to a value of the second capacitance.

11. The method of claim 10, providing the input signal to the inverting input of the amplifier through a second resistance.

12. The method of claim 10, further comprising:
using a third feedback path including a second resistance, providing feedback from the output of the amplifier to the inverting input of the amplifier.

13. The method of claim 10, wherein the first capacitance is less than the second capacitance.

14. The method of claim 10, wherein a linear gain profile of the amplifier circuit is based on a value of the second capacitance.

* * * * *